United States Patent
Yoshida et al.

(10) Patent No.: US 11,413,662 B2
(45) Date of Patent: Aug. 16, 2022

(54) SUBSTRATE CLEANING APPARATUS AND SUBSTRATE CLEANING METHOD

(71) Applicant: SCREEN Holdings Co., Ltd., Kyoto (JP)

(72) Inventors: Yukifumi Yoshida, Kyoto (JP); Ayumi Higuchi, Kyoto (JP); Naoko Yamaguchi, Kyoto (JP)

(73) Assignee: SCREEN Holdings Co., Ltd.

( * ) Notice: Subject to any disclaimer, the term of this patent is extended or adjusted under 35 U.S.C. 154(b) by 5 days.

(21) Appl. No.: 16/471,629

(22) PCT Filed: Dec. 22, 2017

(86) PCT No.: PCT/JP2017/046090
§ 371 (c)(1),
(2) Date: Jun. 20, 2019

(87) PCT Pub. No.: WO2018/128093
PCT Pub. Date: Jul. 12, 2018

(65) Prior Publication Data
US 2020/0086360 A1    Mar. 19, 2020

(30) Foreign Application Priority Data
Jan. 5, 2017  (JP) .............................. JP2017-000676
Dec. 18, 2017 (JP) .............................. JP2017-241845

(51) Int. Cl.
*B08B 7/00* (2006.01)
*H01L 21/02* (2006.01)
*H01L 21/67* (2006.01)

(52) U.S. Cl.
CPC ...... *B08B 7/0014* (2013.01); *H01L 21/02057* (2013.01); *H01L 21/6704* (2013.01)

(58) Field of Classification Search
CPC ............. B08B 7/0014; H01L 21/02057; H01L 21/6704; H01L 21/67103; H01L 21/68792; H01L 21/67051
(Continued)

(56) References Cited

U.S. PATENT DOCUMENTS 7,799,141 B2 *  9/2010  Korolik ............. H01L 21/02052
                                                    134/6
8,898,928 B2 * 12/2014  Sirard ............... H01L 21/02057
                                                    34/284
(Continued)

FOREIGN PATENT DOCUMENTS

JP      11-101970 A      4/1999
JP    2014-197717 A     10/2014
(Continued)

OTHER PUBLICATIONS

International Search Report dated Mar. 20, 2018 in corresponding PCT International Application No. PCT/JP2017/046090.
(Continued)

*Primary Examiner* — Duy Vu N Deo
*Assistant Examiner* — Christopher Remavege
(74) *Attorney, Agent, or Firm* — Ostrolenk Faber LLP

(57) ABSTRACT

A processing solution containing solvent and solute is supplied onto a substrate (9). The processing solution transforms into a particle retention layer as a result of at least part of the solvent being volatilized from the processing solution and causing the processing solution to solidify or harden. The particle retention layer is removed from the substrate (9) by supplying a removal liquid onto the substrate (9). A solute component contained in the particle retention layer is insoluble or poorly soluble in the removal liquid, whereas the solvent is soluble. The solute component contained in the particle retention layer has the property of being altered to
(Continued)

become soluble in the removal liquid when heated to a temperature higher than or equal to an alteration temperature. The removal liquid is supplied after the formation of the particle retention layer, without undergoing a process of alternating the solute component.

22 Claims, 11 Drawing Sheets

(58) Field of Classification Search
USPC .......................................................... 134/4
See application file for complete search history.

(56) References Cited

U.S. PATENT DOCUMENTS

| | | | |
|---|---|---|---|
| 9,443,712 B2* | 9/2016 | Kaneko | H01L 21/67046 |
| 9,953,826 B2* | 4/2018 | Kaneko | H01L 21/67051 |
| 10,043,652 B2* | 8/2018 | Kaneko | H01L 21/02063 |
| 10,272,478 B2* | 4/2019 | Aibara | H01L 21/67028 |
| 10,734,255 B2* | 8/2020 | Sekiguchi | H01L 21/67028 |
| 2002/0088608 A1* | 7/2002 | Park | H01L 21/67103 |
| | | | 165/80.3 |
| 2004/0242121 A1 | 12/2004 | Hirokawa et al. | 451/5 |
| 2006/0154186 A1 | 7/2006 | Minsek et al. | 430/331 |
| 2008/0254223 A1 | 10/2008 | Goto et al. | 427/421.1 |
| 2011/0230054 A1* | 9/2011 | Tomita | H01L 21/02052 |
| | | | 134/28 |
| 2012/0160274 A1 | 6/2012 | Kasai et al. | 134/26 |
| 2013/0014786 A1* | 1/2013 | Ito | H01L 21/67051 |
| | | | 134/34 |
| 2014/0041685 A1 | 2/2014 | Kaneko et al. | 134/4 |
| 2014/0144464 A1 | 5/2014 | Kaneko et al. | 134/4 |
| 2014/0144465 A1* | 5/2014 | Kaneko | H01L 21/68728 |
| | | | 134/4 |
| 2015/0064910 A1* | 3/2015 | Kaneko | B05B 7/00 |
| | | | 438/694 |
| 2015/0064911 A1* | 3/2015 | Kaneko | B05B 12/14 |
| | | | 438/694 |
| 2015/0128994 A1* | 5/2015 | Kaneko | H01L 21/02057 |
| | | | 134/4 |
| 2015/0128995 A1* | 5/2015 | Kaneko | B08B 7/0014 |
| | | | 134/4 |
| 2015/0179433 A1* | 6/2015 | Saio | C11D 3/361 |
| | | | 134/4 |
| 2016/0013047 A1 | 1/2016 | Ogawa | |
| 2016/0035561 A1* | 2/2016 | Aibara | H01L 21/67028 |
| | | | 134/4 |
| 2017/0345685 A1* | 11/2017 | Sekiguchi | H01L 21/67028 |
| 2018/0211828 A1* | 7/2018 | Chung | C08L 67/04 |

FOREIGN PATENT DOCUMENTS

| | | |
|---|---|---|
| JP | 2015-095583 A | 5/2015 |
| KR | 10-2014-0067893 A | 6/2014 |
| TW | 200507984 A | 3/2005 |
| TW | 200629012 A | 8/2006 |
| TW | 200936805 A | 9/2009 |
| TW | 201234454 A1 | 8/2012 |
| TW | 201436010 A | 9/2014 |

OTHER PUBLICATIONS

Written Opinion dated Mar. 20, 2018 in corresponding PCT International Application No. PCT/JP2017/046090.
PCT/IB/326 Notification Concerning Transmittal of International Preliminary Report on Patentability including PCT/IB/373 and PCT/ISA/237 (in Japanese) dated Jul. 18, 2019 for International Application No. PCT/JP2017/046090.
PCT/IB/338 Notification of Transmittal of Translation of the International Preliminary Report on Patentability including PCT/IB/373 and PCT/ISA/237 (in English) dated Jul. 18, 2019 for International Application No. PCT/JP2017/046090.
Decision to Grant of Patent dated Aug. 24, 2020 in corresponding Korean Patent Application No. 10-2019-7018180.

* cited by examiner

SUBSTRATE CLEANING APPARATUS AND SUBSTRATE CLEANING METHOD

CROSS-REFERENCE TO RELATED APPLICATIONS

The present application is a 35 U.S.C. §§ 371 national phase conversion of PCT/JP2017/046090, filed Dec. 22, 2017, which claims priority to Japanese Patent Application Nos. 2017-000676 and 2017-241845, filed Jan. 5, 2017 and Dec. 18, 2017, respectively, the contents of all of which are incorporated herein by reference. The PCT International Application was published in the Japanese language.

TECHNICAL FIELD

The present invention relates to a technique for removing various contaminants adhering to substrates, residues of materials such as processing solutions or resists from upstream processes, various particles, or the like (which are hereinafter simply referred to as "particles") from semiconductor wafers, glass substrates for liquid crystal displays, glass substrates for organic EL displays, glass substrates for plasma displays, optical disk substrates, magnetic disk substrates, magneto-optical disk substrates, glass substrates for photomasks, substrates for solar cells, or the like (which are hereinafter simply referred to "substrates").

BACKGROUND ART

A substrate manufacturing process conventionally includes a cleaning process for removing particles from a substrate. In the cleaning process, in most cases, particles are removed physically from a substrate by supplying a cleaning liquid such as deionized water (hereinafter, expressed as "DIW") to the substrate, or removed chemically from a substrate by supplying a chemical solution to the substrate.

However, miniaturization and complication of patterns make the patterns more susceptible to physical or chemical damage. In view of this, for example with the technique disclosed in Japanese Patent Application Laid-Open Gazette No. 2014-197717, particles are separated from a substrate by supplying a top coat solution onto the substrate and then using contractile force generated during solidification or hardening of the top coat solution. Thereafter, a topcoat and particles are removed from the substrate by dissolving the top coating in a removal liquid.

Meanwhile, according to Japanese Patent Application Laid-Open Gazette No. 2015-95583, a top coat film formed of a top coat solution on a substrate is stripped off with DIW from the substrate. Then, a dissolution processing solution is supplied onto the substrate so that the stripped top coat film is dissolved in the solution on the substrate and removed. Note that the fourth embodiment of Japanese Patent Application Laid-Open Gazette No. 2015-95583 describes a case in which, when a substrate has no pattern formed thereon, the film is stripped off with DIW from the substrate, and the DIW further continues to be supplied so that the film is removed without being dissolved in the solution.

Incidentally, in the case where a film formed on a substrate (this film is hereinafter referred to as a "particle retention layer") is removed from the substrate while being dissolved in a solution, particles may fall off from the particle retention layer and adhere again to the substrate. Also, in the case where the particle retention layer is not dissolved in a solution, it is not easy to remove the particle retention layer from the substrate. In particular, as indicated by Japanese Patent Application Laid-Open Gazette No. 2015-95583, when a substrate has a pattern formed thereon, it is difficult to remove the particle retention layer from the substrate without dissolving the particle retention layer in a solution. The reason for this is considered to be because the particle retention layer remains in clusters of a certain size on the pattern.

SUMMARY OF INVENTION

It is an object of the present invention to improve a particle removal rate with a technique that uses a particle retention layer to remove particles from a substrate.

A substrate cleaning apparatus according to a preferable embodiment of the present invention includes a processing solution supply part that supplies a processing solution containing solvent and solute, onto a substrate, a removal liquid supply part that supplies a removal liquid onto the substrate, and a controller that controls the processing solution supply part and the removal liquid supply part. The solvent has volatility. The processing solution transforms into a particle retention layer as a result of at least part of the solvent being volatilized from the processing solution supplied onto the substrate and causing the processing solution to solidify or harden. A solute component that is the solute contained in the particle retention layer or that is derived from the solute is insoluble or poorly soluble in the removal liquid. The solvent is soluble in the removal liquid. The solute component contained in the particle retention layer has a property of being altered to become soluble in the removal liquid when heated to a temperature higher than or equal to an alteration temperature.

The particle retention layer is removed from the substrate under control of the controller that, after the particle retention layer is formed on the substrate, controls the removal liquid supply part to supply the removal liquid to the particle retention layer without undergoing a process of altering the solute component of the particle retention layer. The substrate cleaning apparatus can improve the particle removal rate.

A substrate cleaning apparatus according to a more preferable embodiment of the present invention further includes a heating part that heats the particle retention layer. The controller controls the heating part to heat the particle retention layer up to a temperature lower than the alteration temperature before the removal liquid is supplied to the particle retention layer.

In a preferable example, the processing solution supply part supplies the processing solution to an upper face of the substrate held in a horizontal position, and the heating part heats the particle retention layer by supplying heated deionized water to a lower face of the substrate.

In another preferable example, the processing solution supply part supplies the processing solution to an upper face of the substrate held in a horizontal position, and the heating part heats the particle retention layer by supplying heated deionized water to the upper face of the substrate.

In yet another preferable example, the removal liquid supply part supplies the removal liquid that is heated up to a temperature lower than the alteration temperature, onto the substrate.

In yet another preferable example, the processing solution supply part supplies the processing solution that is heated up to a temperature lower than the alteration temperature, onto the substrate.

A substrate cleaning apparatus according to another preferable embodiment of the present invention further includes another heating part that heats the substrate up to a temperature lower than the alteration temperature before or in parallel with the supply of the processing solution to the substrate.

Preferably, the substrate cleaning apparatus further includes a substrate holder that holds a substrate. Operations from supplying the processing solution to the substrate to supplying the removal liquid to the substrate are performed while the substrate is held by the substrate holder.

The present invention is also intended for a substrate cleaning method. A substrate cleaning method according to a preferable embodiment of the present invention includes a) supplying a processing solution containing solvent and solute, onto a substrate, and b) supplying a removal liquid onto the substrate. The solvent has volatility. In the operation a), the processing solution transforms into a particle retention layer as a result of at least part of the solvent being volatilized from the processing solution supplied onto the substrate and causing the processing solution to solidify or harden. A solute component that is the solute contained in the particle retention layer or that is derived from the solute is insoluble or poorly soluble in the removal liquid, and the solvent is soluble in the removal liquid. The solute component contained in the particle retention layer has a property of being altered to become soluble in the removal liquid when heated to a temperature higher than or equal to an alteration temperature. After the operation a), the particle retention layer is removed from the substrate by performing the operation b) without undergoing a process of alternating the solute component of the particle retention layer.

A substrate cleaning method according to a more preferable embodiment of the present invention further includes c) heating the particle retention layer up to a temperature lower than the alteration temperature. The operation c) is performed between the operation a) and the operation b).

In a preferable example, in the operation a), the processing solution is supplied to an upper face of the substrate held in a horizontal position, and in the operation c), the particle retention layer is heated by supplying heated deionized water to a lower face of the substrate.

In another preferable example, in the operation a), the processing solution is supplied to an upper face of the substrate held in a horizontal position, and in the operation c), the particle retention layer is heated by supplying heated deionized water to the upper face of the substrate.

In yet another preferable example, in the operation b), the removal liquid that is heated up to a temperature lower than the alteration temperature is supplied onto the substrate.

In yet another preferable example, in the operation a), the processing solution that is heated up to a temperature lower than the alteration temperature is supplied onto the substrate.

In a substrate cleaning method according to another preferable embodiment of the present invention, the substrate is heated up to a temperature lower than the alteration temperature before or during the operation a).

In the above-described substrate cleaning method, preferably, operations from supplying the processing solution to the substrate to supplying the removal liquid to the substrate are performed while the substrate is held by a same substrate holder.

These and other objects, features, aspects and advantages of the present invention will become more apparent from the following detailed description of the present invention when taken in conjunction with the accompanying drawings.

DESCRIPTION OF EMBODIMENTS

Figure 1:
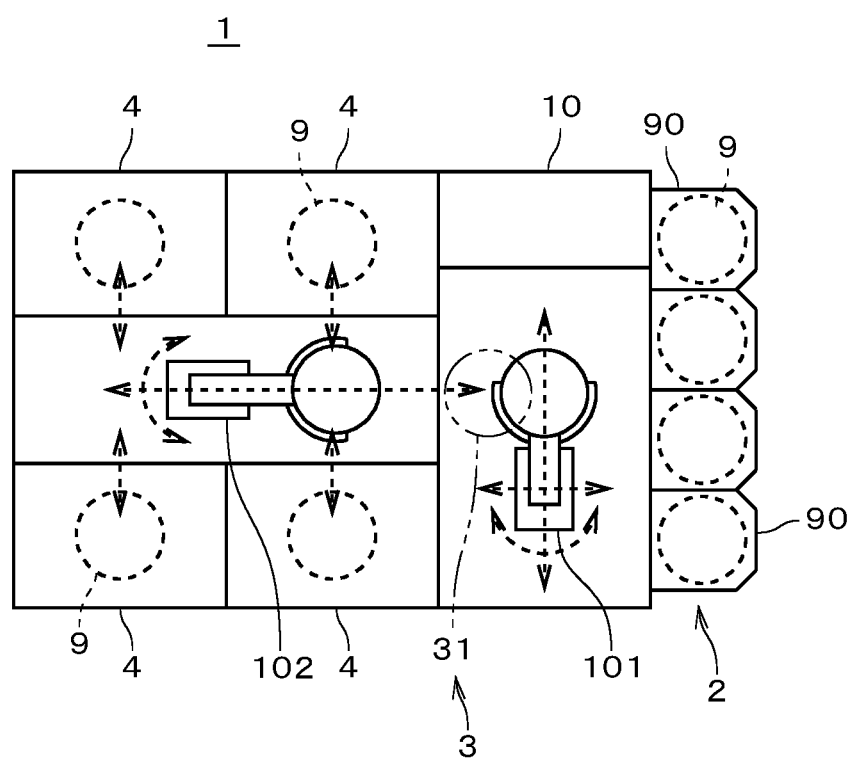
FIG. 1 is a plan view illustrating a configuration of a substrate cleaning system.

FIG. 1 is a plan view illustrating a configuration of a substrate cleaning system 1 according to an embodiment of the present invention. The substrate cleaning system 1 includes a carrier holder 2, a substrate transfer part 3, an indexer robot 101, a center robot 102, four substrate cleaning apparatuses 4, and a controller 10. As will be described later, the controller 10 may be regarded as part of the substrate cleaning apparatuses 4.

Carriers 90 are containers capable of stacking and housing a plurality of substrates 9. The carriers 90 house unprocessed substrates 9 or processed substrates 9. The substrates 9 according to the present embodiment are semiconductor substrates, i.e., so-called wafers. The carrier holder 2 supports a plurality of carriers 90.

As illustrated conceptually by broken-line arrows in FIG. 1, the indexer robot 101 is capable of transporting substrates 9 to an arbitrary position with its arms that are pivotable and movable back and forth while holding the substrates 9. The indexer robot 101 is also movable in the up-down direction while holding the substrates 9. Unprocessed substrates 9 in a carrier 90 that is placed on the carrier holder 2 are transported to a path 31 of the substrate transfer part 3 by the indexer robot 101. The path 31 functions as a buffer that temporarily stores a plurality of substrates 9.

Processed substrates 9 placed on the path 31 are transported by the indexer robot 101 into a carrier 90 that is placed on the carrier holder 2. For convenience of illustration, the path 31 is indicated by a dashed double-dotted line in FIG. 1. The center robot 102 is capable of transporting substrates 9 to an arbitrary position with its arms that are pivotable and movable back and forth while holding the substrates 9. With this operation, the center robot 102 transports the substrates 9 between the path 31 of the substrate transfer part 3 and a substrate cleaning apparatus 4.

Figure 2:
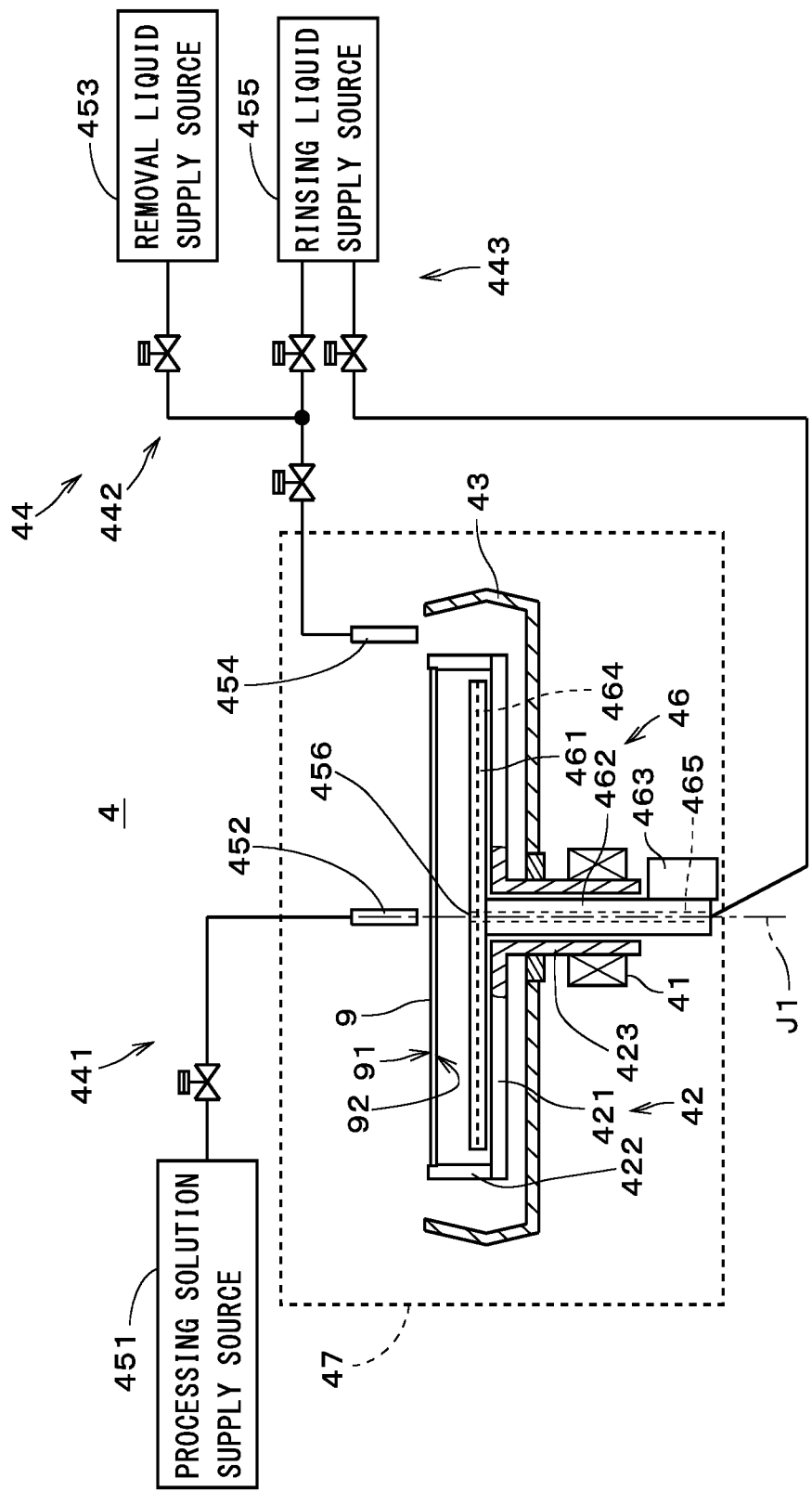
FIG. 2 illustrates a configuration of a substrate cleaning apparatus.

FIG. 2 illustrates a configuration of one substrate cleaning apparatus 4. The substrate cleaning apparatus 4 includes a substrate holder 42, a substrate rotation mechanism 41, a cup 43 that surrounds the substrate holder 42, a supply part 44, a heating part 46, and a chamber 47. At least the substrate holder 42, the cup 43, and the heating part 46 are located within the chamber 47. The substrate holder 42 includes a spin base 421, chucks 422, and a first shaft 423. The spin base 421 has a disk-like shape centered on a central axis J1 of the first shaft 423. The plurality of (e.g., six) chucks 422 is disposed on the upper face of the outer peripheral portion of the spin base 421. An unprocessed substrate 9 transferred from the center robot 102 is placed on the chucks 422. The substrate 9 is held in a horizontal position by the substrate holder 42.

The first shaft 423 is connected to the lower face of the spin base 421 and extends downward from the spin base 421. The central axis J1 of the first shaft 423 passes through the center of the substrate 9. The substrate rotation mechanism 41 rotates the first shaft 423. This causes the substrate holder 42 and the substrate 9 to rotate about the central axis J1. In the present embodiment, the substrate rotation mechanism 41 is a motor having the first shaft 423 as its rotary shaft. The substrate rotation mechanism 41 may have another structure. The substrate holder 42 may also adopt another structure, and for example, may be structured to adsorb the lower face of the substrate 9.

The heating part 46 includes a heating plate 461, a second shaft 462, and a plate elevating mechanism 463. The heating plate 461 has a disk-like shape that extends in a direction perpendicular to the central axis J1. The heating plate 461 is located above the spin base 421. When a substrate 9 is held by the chucks 422, the heating plate 461 is located between the substrate 9 and the spin base 421. A heater 464 is provided in the heating plate 461. The second shaft 462 extends downward from the center of the heating plate 461 along the central axis J1. The first shaft 423 is hollow, and the second shaft 462 is located inside the first shaft 423, passing through the first shaft 423. The plate elevating mechanism 463 moves the second shaft 462 up and down. This causes the heating plate 461 to move up and down.

The supply part 44 includes a processing solution supply part 441, a removal liquid supply part 442, and a rinsing liquid supply part 443. The processing solution supply part 441 includes a processing solution supply source 451, a first nozzle 452, and a first nozzle moving mechanism, which is not shown. The removal liquid supply part 442 includes a removal liquid supply source 453, a second nozzle 454, and a second nozzle moving mechanism, which is not shown. The rinsing liquid supply part 443 includes a rinsing liquid supply source 455, the second nozzle 454, the second nozzle moving mechanism, and a lower nozzle 456. The second nozzle 454 and the second nozzle moving mechanism are included in both of the removal liquid supply part 442 and the rinsing liquid supply part 443.

The first nozzle moving mechanism locates the first nozzle 452 selectively at either an opposing position that opposes an upper face 91 of the substrate 9 or a standby position that is spaced from the substrate 9 in the horizontal direction. The second nozzle moving mechanism locates the second nozzle 454 selectively at either the opposing position that opposes the upper face 91 of the substrate 9 and another standby position that is spaced from the substrate 9 in the horizontal direction. The lower nozzle 456 is provided in the center of the heating plate 461 and opposes a lower face 92 of the substrate 9. The second shaft 462 includes a flow path 465 that is connected to the rinsing liquid supply source 455.

Valves are provided appropriately between the processing solution supply source 451 and the first nozzle 452, between the second nozzle 454 and each of the removal liquid supply source 453 and the rinsing liquid supply source 455, and between the rinsing liquid supply source 455 and the lower nozzle 456. The controller 10 controls the first and second nozzle moving mechanisms and opening and closing of each valve. The ejection of the processing solution from the first nozzle 452, the ejection of the removal liquid from the second nozzle 454, the ejection of the rinsing liquid from the second nozzle 454, and the ejection of the rinsing liquid from the lower nozzle 456 are controlled by the controller 10 controlling the valves.

The controller 10 also controls other constituent elements such as the substrate rotation mechanism 41, the substrate holder 42, and the heating part 46. Thus, some functions of the controller 10 may be regarded as being included in the substrate cleaning apparatus 4. Part of the controller 10 may be provided in the chamber 47 as a constituent element dedicated for each substrate cleaning apparatus 4.

Figure 3:
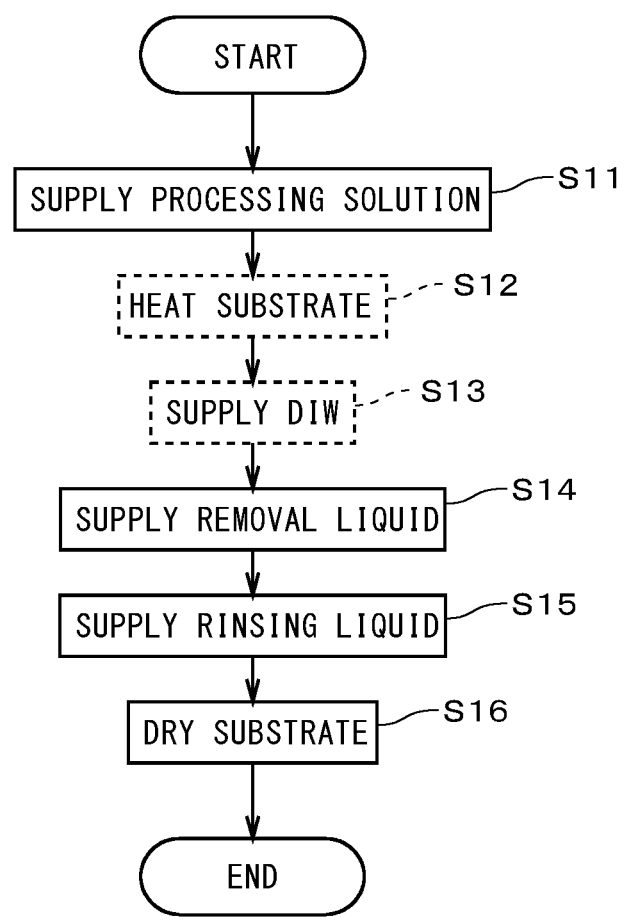
FIG. 3 illustrates a flow of substrate cleaning.

FIG. 3 illustrates a flow of cleaning the substrates 9 in the substrate cleaning apparatus 4. Operations illustrated in FIG. 3 are performed by the controller 10 controlling constituent elements such as the substrate rotation mechanism 41, the heating part 46, the processing solution supply part 441, the removal liquid supply part 442, and the rinsing liquid supply part 443.

First, an unprocessed substrate 9 in a carrier 90 is transported into the substrate cleaning apparatus 4 by the indexer robot 101 and the center robot 102. In the substrate cleaning apparatus 4, the outer edge of the substrate 9 is held by the chucks 422 with the upper face 91, i.e., one main surface, of the substrate 9 facing upward.

The processing solution supply part 441 supplies a processing solution to the upper face of the substrate 9 held in a horizontal position (step S11). Specifically, the first nozzle 452 is moved to the center of the upper face 91 of the substrate 9, and the processing solution is ejected from the first nozzle 452 toward the center of the upper face 91. The processing solution is supplied in the form of liquid columns or in the form of droplets that naturally drop from the nozzle to the substrate 9. The processing solution according to the present embodiment contains polymer as solute and an organic liquid having volatility as solvent. Here, "having volatility" refers to having higher volatility than water. In the case of supplying the processing solution, the substrate rotation mechanism 41 rotates the substrate 9 together with the substrate holder 42 about the central axis J1 at a speed of, for example, ten to several tens of rotations per minute (rpm), so that the processing solution spreads over the upper face 91 of the substrate 9. Thereafter, the substrate 9 is rotated at a high speed of 500 to 1500 rpm, and a surplus of the processing solution is dispersed from the substrate 9 and received by the cup 43.

When the processing solution has spread uniformly over the upper face 91 and the solvent has been volatilized to some extent, the processing solution solidifies or hardens into a solid layer. As a result, particles on the substrate 9 are retained in that layer. Hereinafter, such a layer that is obtained as a result of the processing solution being altered into a solid is referred to as a "particle retention layer."

Here, "solidification" refers to, for example, solidification of the solute due to forces or the like acting between molecules or atoms. Also, "hardening" refers to, for example, solidification of the solute due to chemical changes such as polymerization or crosslinking. Accordingly, "solidification or hardening" means "solidification" caused by various factors. Note that it is sufficient for the processing solution to solidify or harden to such an extent that it can retain particles, and the solvent does not necessarily have to be completely volatilized.

Preferably, the processing solution shrinks and transforms into the particle retention layer in accordance with the volatilization of the solvent. This causes particles on the substrate 9 to be separated from the surface of the substrate 9 by the force received from the particle retention layer.

Next, the substrate 9 is heated by the heating part 46 (step S12). The particle retention layer is considered to further shrink due to the heating. The heating of the substrate 9 also means the heating of the particle retention layer. Step S12 is not an absolute necessity. If step S12 is not performed, a state in which the substrate 9 is held by the substrate holder 42 is maintained for a predetermined period of time.

Figure 4:
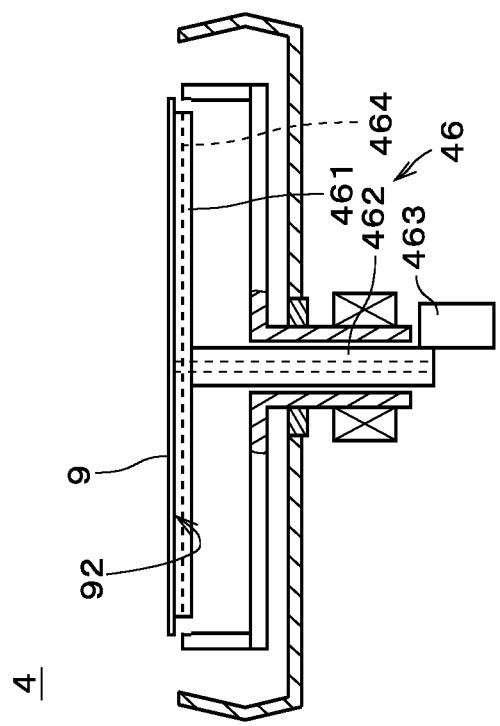
FIG. 4 illustrates heat treatment performed by the substrate cleaning apparatus.

In the case of heating the substrate 9, the temperature of the heating plate 461 is increased to a predetermined value by the heater 464 in the heating plate 461. As illustrated in FIG. 4, the heating plate 461 is moved upward by the plate elevating mechanism 463 so that the upper face of the heating plate 461 lifts up the substrate 9 in contact with the lower face 92 of the substrate 9. Accordingly, the substrate 9 is heated with the heat from the heating plate 461. Alternatively, the substrate 9 may be heated by bringing the heating plate 461 into close proximity to the lower face 92 of the substrate 9, or may be heated using both of the states in which the heating plate 461 is in contact with the lower face 92 of the substrate 9 and in which the heating plate 461 is in close proximity thereto.

The supply of the processing solution in step S11 and the heating in step S12 may be performed in parallel. That is, the heating may be performed after the solidification or hardening of the processing solution, or may be performed during the volatilization of the solvent. At the time of forming particle retention layer, usually only part of the solvent contained in the processing solution is volatilized, but the solvent may almost completely be volatilized from the processing solution. That is, the volatilization of at least part of the solvent causes the solute component of the processing solution to solidify or harden.

In the following description, a component of the particle retention layer that corresponds to the solute in the processing solution is referred to as a "solute component." The solute component may be the solute itself in the processing solution, or may be derived from the solute, e.g., obtained as a result of chemical changes or the like. According to the present embodiment, the solute component of the particle retention layer is altered to become soluble when heated to a temperature higher than or equal to an alteration temperature. In step S12, however, the heating part 46 heats the particle retention layer only up to a temperature lower than the alteration temperature under the control of the controller 10. This enables maintaining the insolubility of the solute component without causing alternation, while accelerating the volatilization of the solvent. The alteration temperature varies depending on the type of the solute, and as shown in experimental examples, which will be described later, the alteration temperature can be specified by experiment. Similarly, in the case where the particle retention layer is not heated, the insolubility of the solute component is maintained without alternation.

DIW (Deionized water) is supplied onto the particle retention layer (step S13). Although the DIW is supplied by the rinsing liquid supply part 443 in the present embodiment, a separate DIW supply part with the same structure as that of the rinsing liquid supply part 443 may be provided additionally. The supply of the DIW to the particle retention layer improves the hydrophilic property of the particle retention layer. To supply the DIW, the second nozzle 454 is moved to the center of the upper face 91 of the rotating substrate 9, and the DIW is supplied from the second nozzle 454 to the center of the upper face 91. The DIW is supplied not in spray form, but in the form of liquid columns or in the form of droplets that naturally drop from the nozzle. The DIW dispersed from the rotating substrate 9 is received by the cup 43. In step S13, the second nozzle 454 may swing in the horizontal direction. Note that the supply of the DIW to the particle retention layer may be omitted.

Next, the removal liquid supply part 442 supplies a removal liquid to the particle retention layer on the substrate 9 (step S14). Specifically, the second nozzle 454 is moved to the center of the upper face 91 of the substrate 9, and the removal liquid is supplied from the second nozzle 454 to the center of the upper face 91 while the substrate 9 is rotated at 500 to 800 rpm, for example. The removal liquid is supplied not in spray form, but in the form of liquid columns or in the form of droplets that naturally drop from the nozzle. The removal liquid is dispersed from the outer edge of the substrate 9 and received and collected by the cup 43. In the present embodiment, an aqueous solution used in SC-1 cleaning (hereinafter, referred to as an "SC-1 solution"), i.e., an aqueous solution of ammonia and hydrogen peroxide, is used as the removal liquid. Alternatively, the removal liquid may be an aqueous ammonia solution.

Here, as described previously, the solute component of the particle retention layer is insoluble in water. That is, the solute component according to the present embodiment is insoluble in the removal liquid. On the other hand, the solvent remaining in the particle retention layer is soluble in water. That is, the solvent according to the present embodiment is soluble in the removal liquid. Accordingly, by supplying the removal liquid to the particle retention layer without the need for the process of altering the solute component of the particle retention layer, the solute component of the particle retention layer can be removed together with the remaining solvent from the substrate 9 while retaining particles and without being dissolved in the removal liquid. At this time, the solute component is assumed to be removed in a large number of fine clusters due to the influence of the solvent remaining in the particle retention layer. As a result, particles will not be discharged from the particle retention layer onto the substrate 9 as will be described later, and a high particle removal rate can be achieved. Note that, if the solute component of the particle retention layer can be removed with the removal liquid, the solvent does not necessarily have to remain in the particle retention layer.

The rinsing liquid supply part 443 further supplies a rinsing liquid onto the substrate 9 (step S15). In the present embodiment, DIW is used as the rinsing liquid. The DIW is supplied from the second nozzle 454 to the center of the upper face 91 of the rotating substrate 9. The rinsing liquid is supplied not in spray form, but in the form of liquid columns or in the form of droplets that naturally drop from the nozzle. Simultaneously at this time, the DIW is also supplied from the lower nozzle 456 to the center of the lower face 92 of the substrate 9. The DIW dispersed from the substrate 9 is received by the cup 43. In steps S14 and S15, the second nozzle 454 may swing in the horizontal direction. Then, the supply of the DIW is stopped, and the substrate 9 is further rotated so as to be dried (step S16). The substrate 9 may be dried by other techniques such as supplying dry gas, decompression, or heating.

In the substrate cleaning apparatus 4, processes from supplying the processing solution to the substrate 9 to supplying the removal liquid to the substrate 9 are performed while the substrate 9 is held by the same substrate holder 42. That is, this processing is performed without the substrate 9 being transported out of the chamber 47. This minimizes the space for installation of the substrate cleaning apparatus 4. In the present embodiment, processes up to drying are performed while the substrate 9 is held by the substrate holder 42. Processing the substrate 9 that is held by the substrate holder 42 means that the substrate 9 is processed within the chamber 47.

In the above-described series of processing, the substrate 9 is heated but not up to the alteration temperature, or the substrate 9 is not heated. This allows the substrate cleaning apparatus 4, which performs processing within the same chamber, to be designed more easily than in the case where the substrate 9 is heated to a temperature exceeding the alteration temperature. Moreover, the possibility of particles adhering to the substrate 9 can be reduced by performing the series of processing within the same chamber.

Figure 5:
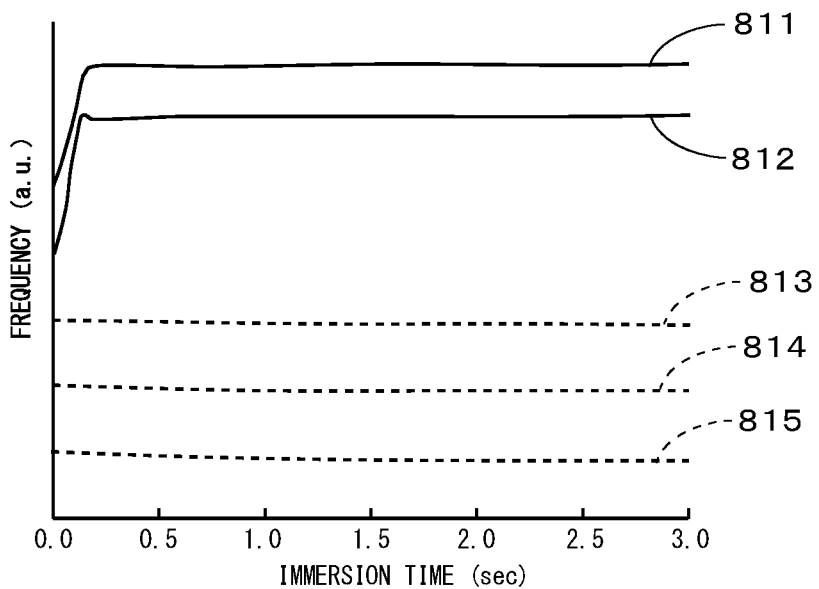
FIG. 5 illustrates the results of measurement using the QCM method.

FIG. 5 is a diagram for describing that the solute component of the particle retention layer formed in the present embodiment has the property of becoming water-soluble by heating. FIG. 5 illustrates the results of measurement using the QCM (quartz crystal microbalance) method. In this experiment, a film of gold was formed on a quartz oscillator and a particle retention layer was formed thereon. Then, the particle retention layer was immersed in an SC-1 solution and oscillated by the oscillator. According to the QCM method, the oscillation frequency increases as the particle retention layer adhering to the film of gold increases in mass.

Lines designated by reference signs 811, 812, 813, and 814 respectively indicate results in the cases where the particle retention layer was heated to 250° C., 200° C., 150° C., and 100° C., and a line designated by a reference sign 815 indicates a result in the case where the particle retention layer was not heated. The alteration temperature of the particle retention layer was approximately 200° C., and in the case where the particle retention layer was heated to 250° C. and 200° C., the frequency became high, and this shows that the particle retention layer dissolved in the SC-1 solution. It can also be seen that in the case where the particle retention layer was heated to 150° C. or less, the particle retention layer kept adhering to the top of the film of gold and did not dissolve in the solution.

Figure 6:
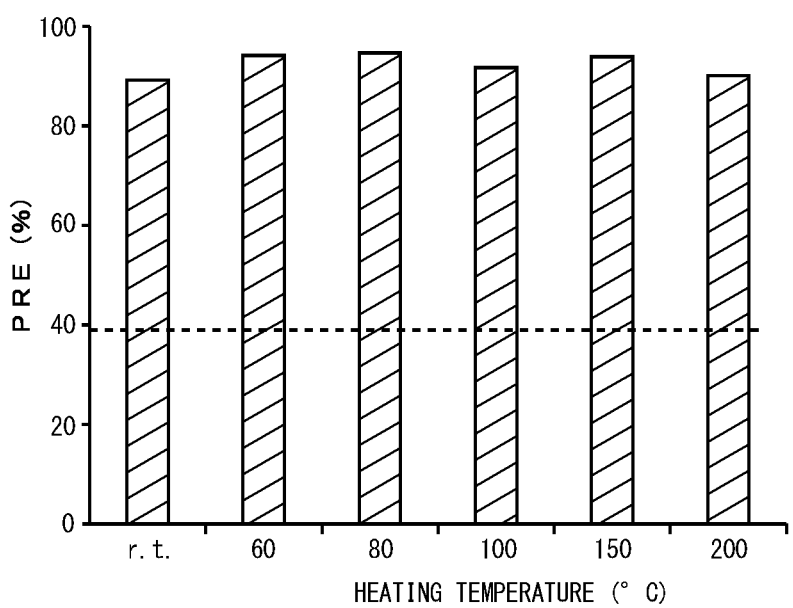
FIG. 6 illustrates the results of measuring a PRE (particle removal rate)

FIG. 6 illustrates the results of measuring the removal rate of particles with a predetermined particle diameter or more in the case where $SiO_2$ particles were caused to adhere to the top of an Si substrate and the cleaning illustrated in FIG. 3 was performed. Hereinafter, the particle removal rate is expressed as "PRE." To be precise, other processing such as pre-processing is added to the processing illustrated in FIG. 3. The results for the cases in which the particle retention layer was not heated (at room temperature) in step S12 and in which the particle retention layer was heated to 60° C., 80° C., 100° C., 150° C., and 200° C. in step S12 are shown in order from the left. The room temperature was, for example, higher than or equal to 20° C. and lower than or equal to 30° C. The broken line indicates the PRE in the case where the cleaning was performed using only the SC-1 solution, and the PRE was 39%.

In any case, it can be seen that higher PREs were achieved than in the case where the cleaning was performed using only the SC-1 solution. Note that in the case where the particle retention layer was heated to 200° C., the solute component of the particle retention layer was dissolved, and therefore, the PRE decreased slightly from that in the case where the particle retention layer was heated to 150° C.

Figure 7:
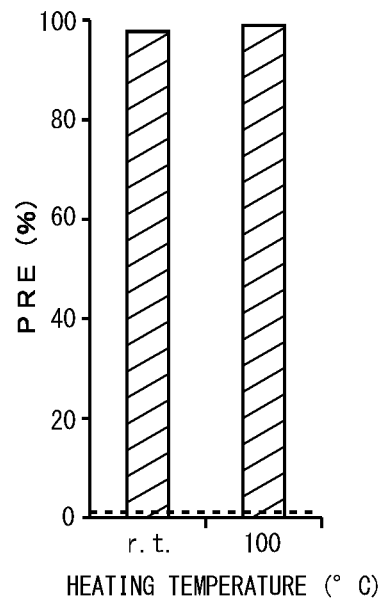
FIG. 7 illustrates the results of measuring the PRE.

FIG. 7 illustrates the results of measuring the PRE for particles with a predetermined particle diameter or more in the case where PSL (polystyrene latex) particles were caused to adhere to the top of an Si substrate and the same cleaning as that in FIG. 6 was performed. The results for the cases in which the particle retention layer was not heated (at room temperature) in step S12 and in which the particle retention layer was heated to 100° C. in step S12 are shown in order from the left. Note that the particle retention layer was heated to 120° C. when the PSL particles are caused to adhere to the substrate. The broken line indicates the PRE in the case where the cleaning was performed using only the SC-1 solution, and the PRE was 0.8%. In either case, it can be seen that much higher PREs were achieved than in the case where the cleaning was performed using only the SC-1 solution.

Figure 8:
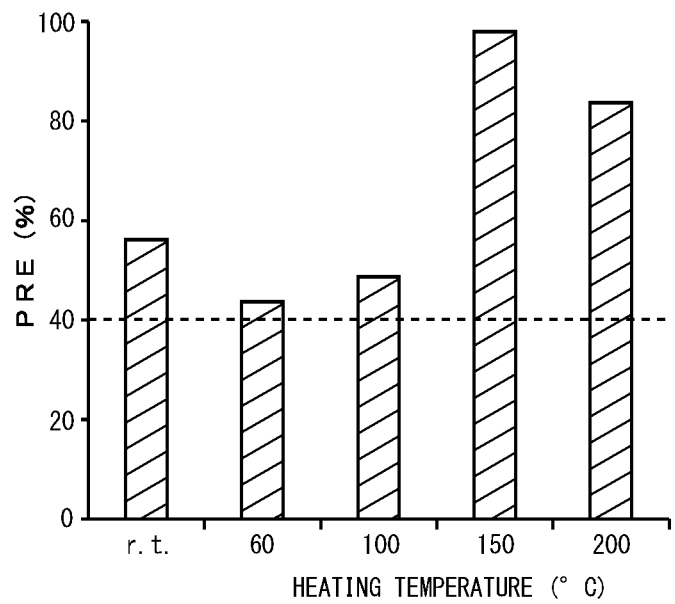
FIG. 8 illustrates the results of measuring the PRE.

FIG. 8 illustrates the results of measuring the PRE for particles with a predetermined particle diameter or more in the case where $SiO_2$ particles were caused to adhere to the top of an SiN substrate and the same cleaning as that in FIG. 6 was performed. The results for the cases in which the particle retention layer was not heated (at room temperature) in step S12 and in which the particle retention layer was heated to 60° C., 100° C., 150° C., 200° C. in step S12 are shown in order from the left. The broken line indicates the PRE in the case where the cleaning was performed using only the SC-1 solution, and the PRE was 39.9%.

In any case, it can be seen that higher PREs were achieved than in the case where the cleaning was performed using only the SC-1 solution. Note that in the case where the particle retention layer was heated to 200° C., the solute component of the particle retention layer was dissolved, and therefore, the PRE decreased significantly from that in the case where the particle retention layer was heated to 150° C.

Figure 9:
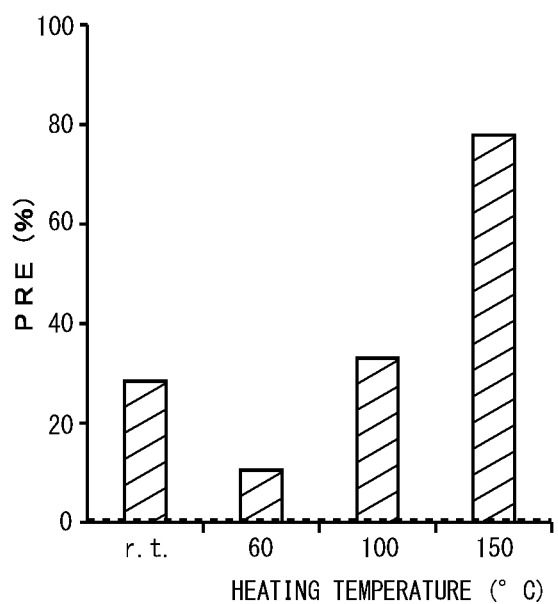
FIG. 9 illustrates the results of measuring the PRE.

FIG. 9 illustrates the results of measuring the PRE for particles with a predetermined particle diameter or more in the case where PSL particles were caused to adhere to the top of an SiN substrate and the same cleaning as that in FIG. 6 was performed. The results for the cases in which the particle retention layer was not heated (at room temperature) in step S12 and in which the particle retention layer was heated to 60° C., 100° C., and 150° C. in step S12 are shown in order from the left. The broken line indicates the PRE in the case where the cleaning was performed using only the SC-1 solution, and the PRE was 0.5%. In any case, it can be seen that much higher PREs were achieved than in the case where the cleaning was performed using only the SC-1 solution.

It can be seen from FIGS. 6 to 9 that the cleaning method according to the present embodiment can achieve a high PRE without depending on the type of the substrates 9.

Figure 10:
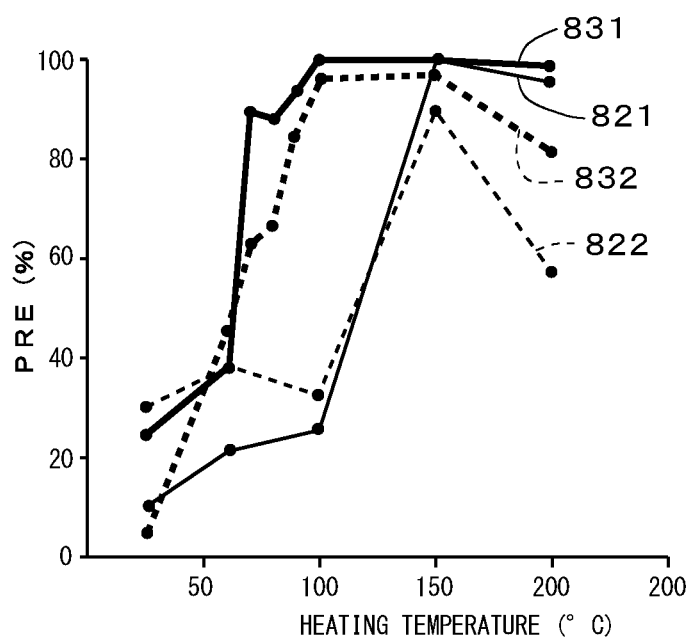
FIG. 10 illustrates the results of measuring the PRE.

FIG. 10 illustrates the results of yet another measurement of the PRE. A line designated by a reference sign 821 indicates a relationship between the heating temperature and the PRE in the case where the particle retention layer was formed to a thickness of 30 nm on a substrate with no pattern. A line designated by a reference sign 822 indicates a relationship between the heating temperature and the PRE in the case where the particle retention layer was formed to a thickness of 30 nm on a substrate with a pattern. A line designated by a reference sign 831 indicates a relationship between the heating temperature and the PRE in the case where the particle retention layer was formed to a thickness of 75 nm on a substrate with no pattern. A line designated by a reference sign 832 indicates a relationship between the heating temperature and the PRE in the case where the particle retention layer was formed to a thickness of 75 nm on a substrate with a pattern. In any case, $SiO_2$ particles were used as particles.

It can be seen from FIG. 10 that, in the case where the heating temperature was 200° C., the PRE became lower than that in the case where the heating temperature was 150° C. In particular, in the case where the substrate had a pattern, the PRE decreased sharply if the particle retention layer was heated to 200° C. and became soluble in the removal liquid. In FIG. 10, the PRE decreased in the cases where the heating temperature was lower than 150° C. This might have been caused due to insufficient volatilization of the solvent.

From the above, it can be said that the PRE can be improved by intentionally maintaining the insolubility of the solute component of the particle retention layer in the removal liquid, rather than by dissolving the solute component in the solution. Also, by heating the particle retention layer at a temperature as high as possible without causing alteration, the particle retention layer can be efficiently caused to solidify or harden, a high PRE can be achieved within a short time. This technique is in particular suitable for the cleaning of a substrate 9 having a pattern. Also, the pattern is less damaged than in conventional physical cleaning using a spray of SC-1 solution.

Figure 11A:
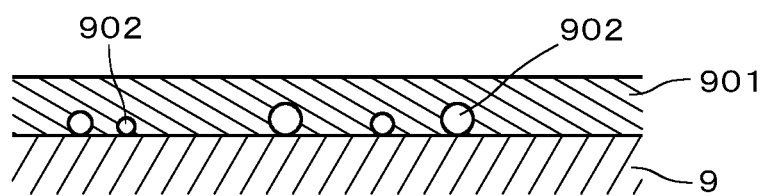
FIG. 11A is a conceptual diagram illustrating a particle retention layer.

FIG. 11A is a conceptual diagram illustrating a particle retention layer 901 formed on a substrate 9. The particle retention layer 901 retains particles 902 adhering to the top of the substrate 9 so as to surround the particles 902. The particle retention layer 901 strips the particles 902 off from the surface of the substrate 9 when the solvent is volatilized from the processing solution and the solute component shrinks. Note that not only the solute component shrinks due to the volatilization of the solvent, but also the solute component itself preferably has the property of further shrinking due to other factors. Examples of the other factors include natural shrinkage of the solute component itself, shrinkage due to heating, and chemical changes.

Figure 11B:
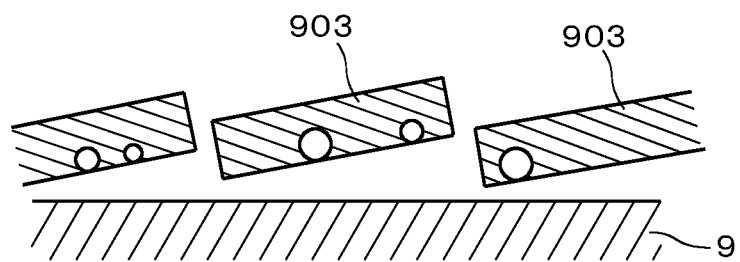
FIG. 11B is a conceptual diagram illustrating how the particle retention layer is removed.

Since, as described previously, the solute component of the particle retention layer 901 is insoluble in the removal liquid, when the removal liquid is supplied to the substrate 9, the particle retention layer 901 is considered to be divided into fine pieces 903 by the physical force received from the removal liquid and be removed from the substrate 9 as illustrated in FIG. 11B. Accordingly, the particles 902 are removed from the substrate 9 without being discharged from the particle retention layer 901. In particular, since the solvent is soluble in the removal liquid, it is conceivable that the solvent remaining between the substrate 9 and the particle retention layer 901 will facilitate the stripping of the particle retention layer 901 from the substrate 9.

In the case where the particle retention layer having no alteration temperature is stripped off from a substrate without being dissolved in the solution, it is difficult to strip the particle retention layer off from a substrate that has a pattern, as described in Japanese Patent Application Laid-Open Gazette No. 2015-95583. The reason for this is considered to be because the particle retention layer remains in large clusters on the substrate. However, the inventors of the present invention have found that this problem does not occur if the particle retention layer (to be precise, its solute component) has an alteration temperature. In this case, the particle retention layer is considered to be divided into fine pieces that cannot be observed by the naked eye, and removed from the substrate even if the particle retention layer is not dissolved in the solution. Thus, particles can be removed efficiently from even a substrate that has a pattern.

Since the removal liquid is ejected tenderly from the nozzle, the removal liquid is supplied in the form of liquid columns or large droplets onto the substrate 9. Therefore, the pattern is less damaged than in the case where a cleaning liquid is supplied vigorously in spray form to a substrate 9 as in conventional technology.

The above-described embodiment achieves a high PRE without intentionally heating the processing solution that becomes soluble in the removal liquid when heated to the alteration temperature, or by using the processing solution that is heated to a temperature lower than the alteration temperature and exceeding the room temperature. This effect uses the property that the particle retention layer that is altered by heating can be removed with the removal liquid.

On the other hand, the property that the particle retention layer can be divided into fine pieces in the removal liquid and removed from the substrate, irrespective of the fact that the solute component of the particle retention layer is insoluble in the removal liquid, may be achieved by other factors. For example, in the case where part of the solvent that is soluble in the removal liquid is not volatilized and remains in the particle retention layer, the removal of the insoluble solute component with the removal liquid, i.e., the removal of the particle retention layer (to be precise, the solute component) with the removal liquid, may be achieved by molecules of the removal liquid entering between molecules of the solute component. In this case, the property that the solute component becomes soluble in the removal liquid when heated is not an absolute necessity.

Although the heating part 46 of the substrate cleaning apparatus 4 illustrated in FIG. 2 uses the heating plate 461 to heat the substrate 9, i.e., to heat the particle retention layer, various other techniques can be employed to heat the particle retention layer. For example, the substrate 9 may be heated with light emitted from a lamp. A face of the substrate 9 that is to be heated may be the upper face 91, or may be the lower face 92. Alternatively, the particle retention layer may be heated by bringing a heated plate into close proximity to the upper face 91 of the substrate 9. As another alternative, the particle retention layer may be heated by supplying heated DIW or any other liquid to the substrate 9 as will be described below.

Figure 12:
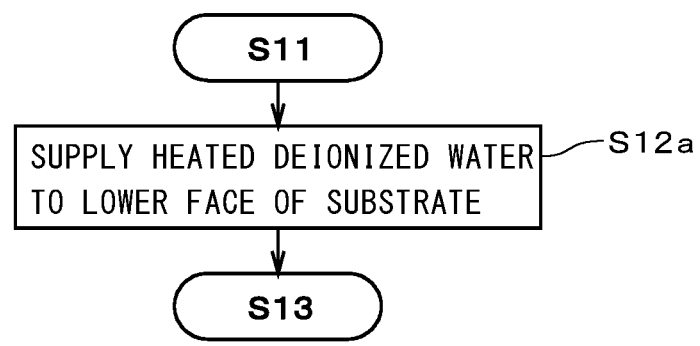
FIG. 12 illustrates part of another exemplary operation performed by the substrate cleaning apparatus.

Next, some other exemplary operations of the substrate cleaning apparatus 4 will be described. In a preferable exemplary operation, instead of step S12 in FIG. 3, the substrate 9 is heated, i.e., the particle retention layer is heated, by supplying heated DIW to the lower face of the substrate 9 held in a horizontal position as illustrated in step S12a in FIG. 12. The particle retention layer is heated to a temperature higher than the room temperature and lower than 100° C. The heating of the particle retention layer causes shrinkage of the particle retention layer. In the case of this exemplary operation, a heater that pre-heats DIW ejected from the lower nozzle 456 is provided for the heating part 46, and the heater and the lower nozzle 456 function as the heating part 46.

In the case where the substrate 9 is heated with DIW, the heating plate 461 can be omitted. By supplying heated DIW to the lower face of the substrate 9, the substrate 9 can be heated with a simple structure and without giving any influence on the upper face that is to be cleaned. The operations of the substrate cleaning apparatus 4 are the same as those in FIG. 3, except that the particle retention layer is heated by supplying heated DIW to the lower face of the substrate 9. Although the supply of ordinary-temperature DIW in step S13 is desirably performed, this supply may be omitted.

Figure 13:
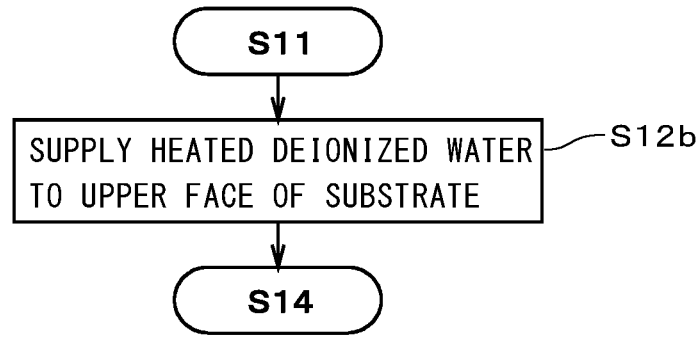
FIG. 13 illustrates part of yet another exemplary operation performed by the substrate cleaning apparatus.

As illustrated in step S12b in FIG. 13, the substrate 9 may be heated by supplying heated DIW to the upper face of the substrate 9 held in a horizontal position. Step S12b is a process that combines steps S12 and S13 in FIG. 3. In the case of this exemplary operation, a heater that pre-heats DIW ejected from the second nozzle 454 is provided for the heating part 46. The heater and the second nozzle 454 function as the heating part 46. Since the substrate 9 is heated with the DIW, the heating plate 461 may be omitted. It is conceivable that the solvent remaining in the particle retention layer is removed and the particle retention layer is heated by the supply of the heated DIW to the upper face of the substrate 9, thereby causing shrinkage of the particle retention layer.

Although, with the supply of the DIW, part of the solute component of the particle retention layer may be removed from the substrate 9, the particle retention layer is normally not removed completely with the DIW, and therefore the DIW does not function as the removal liquid in step S14. The substrate 9 may be heated by supplying the heated DIW to the upper and lower faces of the substrate 9 held in a horizontal position. This operation is also a process that combines steps S12 and S13 in FIG. 3.

Figure 14:
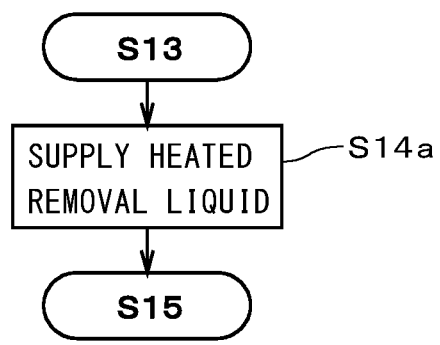
FIG. 14 illustrates part of yet another exemplary operation performed by the substrate cleaning apparatus.

As illustrated in step S14a in FIG. 14, instead of step S14 in FIG. 3, the removal liquid supply part 442 may supply a heated removal liquid onto the substrate 9. That is, the removal liquid that is heated up to a temperature lower than the alteration temperature is supplied to the upper face of the substrate 9 held in a horizontal position. Step S14a also serves as the process of heating the particle retention layer in step S12 in FIG. 3. Thus, normally step S12 is omitted. However, step S14a may be performed after execution of step S12.

In the case where the heated removal liquid is supplied, the supply of the DIW in step S13 may be performed, or may not be performed. In the case where performing only step S14a is not enough to heat the particle retention layer, the supply of the heated DIW in step S12a illustrated in FIG. 12 and/or step S12b illustrated in FIG. 13 may be performed before step S14a. The supply of the heated removal liquid enables simultaneous execution of the heating of the particle retention layer and the supply of the removal liquid.

Figure 15:
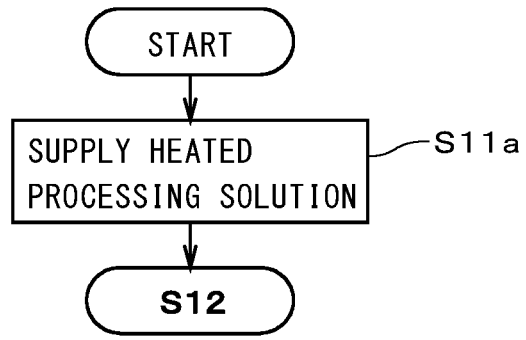
FIG. 15 illustrates part of yet another exemplary operation performed by the substrate cleaning apparatus.
Figure 16:
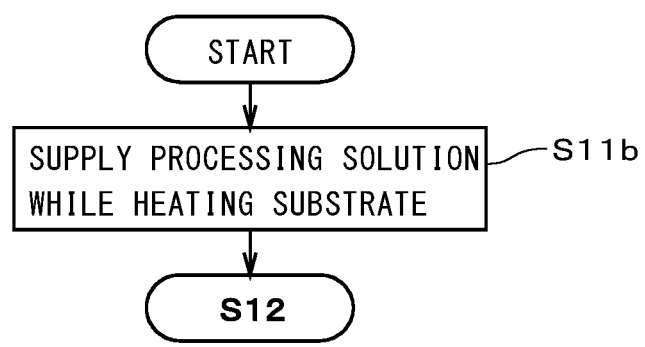
FIG. 16 illustrates part of yet another exemplary operation performed by the substrate cleaning apparatus.
Figure 17:
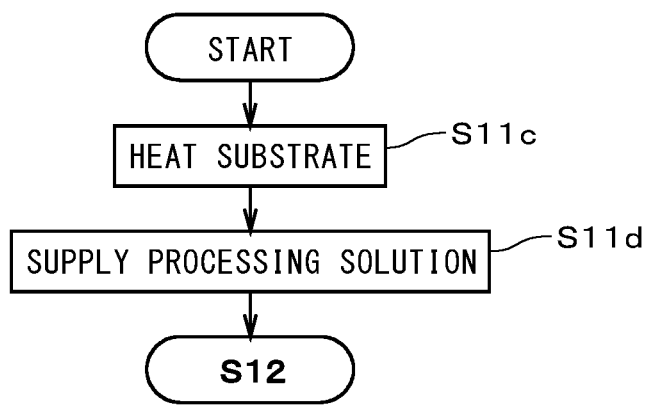
FIG. 17 illustrates part of yet another exemplary operation performed by the substrate cleaning apparatus.

FIGS. 15 to 17 are diagrams illustrating examples in which the particle retention layer is heated at the stage when the particle retention layer is formed. In step S11a in FIG. 15, which is performed instead of step S11 in FIG. 3, the processing solution supply part 441 supplies a heated processing solution onto the substrate 9. That is, a processing solution that is heated up to a temperature lower than the alteration temperature is supplied to the upper face of the substrate 9 held in a horizontal position. This causes the solvent to be volatilized in parallel with the formation of the particle retention layer and accelerates the separation of particles from the substrate 9 due to shrinkage of the particle retention layer.

In step S11b in FIG. 16, which is performed instead of step S11 in FIG. 3, the heating of the substrate 9 and the supply of the processing solution are performed in parallel. That is, the formation of the particle retention layer and the heating of the particle retention layer are performed at the same time. During the formation of the particle retention layer, the particle retention layer shrinks due to the volatilization and heating of the solvent. The heating of the substrate 9 to a temperature lower than the alteration temperature is implemented by, for example, the heating part 46 in FIG. 2. The heating may be implemented by other techniques such as irradiating the upper or lower face of the substrate 9 with light emitted from a lamp, bringing a heated plate to the upper face of the substrate 9, or supplying heated DIW to the lower face of the substrate 9 as described previously.

In steps S11c and S11d in FIG. 17, which are performed instead of step S11 in FIG. 3, a processing solution is supplied after the substrate 9 is heated. In other words, the substrate 9 is heated up to a temperature lower than the alteration temperature before the supply of the processing solution. The heating of the substrate 9 to a temperature lower than the alteration temperature in step S11c is implemented by, for example, the heating part 46 in FIG. 2. The heating may be implemented by supplying heated DIW as in FIGS. 12 and 13, or by other techniques such as irradiating the upper or lower face of the substrate 9 with light emitted from a lamp or bringing a heated plate to the upper face of the substrate 9 as described previously. Note that it is possible to perform both of the process for heating the substrate 9 before or during the supply of the processing solution and the process for supplying the heated processing solution to the substrate 9.

In the case where the particle retention layer is heated almost simultaneously with its formation as illustrated in FIGS. 15 to 17, the heating of the particle retention layer in step S12 and the supply of the heated DIW or the heated removal liquid are, in principle, unnecessary. However, these processes may be performed. It goes without saying that ordinary-temperature DIW may be supplied to the upper face of the substrate 9 in step S13.

Different heating parts may be used as the heating part configured to heat the particle retention layer in step S12 in FIG. 3 and the heating part configured to heat the particle retention layer in step S11b in FIG. 16 and step S11c in FIG. 17. For example, the substrate 9 may be heated with the heating plate 461 in step S11b or S11c and may be heated with the heated DIW in step S12. In other words, the heating part that heats the substrate 9 before the supply of the removal liquid to the substrate 9 and the heating part that heats the substrate 9 before or in parallel with the supply of the processing solution to the substrate 9 may be different heating parts, or may be the same heating part.

The substrate cleaning system 1 and the substrate cleaning apparatus 4 described above may be modified in various ways.

The processing solution supply part 441 may supply the processing solution by a different method other than ejecting the solution from the nozzle. The removal liquid supply part 442 and the rinsing liquid supply part 443 may also supply the removal liquid and the rinsing liquid by a different method other than ejecting the liquids from the nozzles. Preferably, it is desirable to adopt techniques that cause less damage to the pattern on the surface of the substrate 9.

Yet another technique may be adopted to heat the particle retention layer by heating the substrate 9. For example, the substrate 9 may be heated by supplying high-temperature gas to the upper face 91 or lower face 92 of the substrate 9.

The substrate 9 may be heated within another dedicated chamber. Moreover, the formation, heating, and removal of the particle retention layer may be performed within different chambers.

Although the solute component of the particle retention layer according to the present embodiment is changed from having insolubility to having solubility by being heated up to the alteration temperature, various solute components and removal liquids may be used as long as the solute component can be changed from being insoluble in the removal liquid to being soluble in the removal liquid. Also, the solvent is not limited to a water-soluble solvent as long as it is soluble in the removal liquid.

The temperature to which the particle retention layer is heated may be any temperature that is lower than the alteration temperature, and may be a temperature at which the particle retention layer changes to become slightly soluble in water. The solute component of the particle retention layer does not necessarily have to be completely insoluble in the removal liquid, and may be poorly soluble in the removal liquid.

The volatile solvent contained in the processing solution is preferably of an organic type, i.e., an organic compound, but it may contain other volatile substances. Although the solute according to the above-described embodiment is polymer, the solute may be an organic compound other than polymer. As another alternative, the solute may be a mixture of an organic compound and other substances, or may be a compound other than organic compounds.

The removal liquid is not limited to the SC-1 solution. Although the use of the SC-1 solution or the aqueous ammonia solution is desirable in order to prevent the re-adhesion of the removed particle retention layer, other removal liquids may be used.

The cleaning process performed by the substrate cleaning apparatus 4 may include other processes in addition to the processes described in the above embodiment. For example, pre-processing or post-processing may be added to each process.

The substrates 9 cleaned by the substrate cleaning system 1 are not limited to Si substrates or SiN substrates, and may be other semiconductor substrates. The substrates 9 are not limited to semiconductor substrates, and may be other substrates such as glass substrates for liquid crystal displays, glass substrates for organic EL displays, glass substrates for plasma displays, optical disk substrates, magnetic disk substrates, magneto-optical disk substrates, glass substrates for photomasks, and substrates for solar cells.

The configurations of the preferred embodiments and variations described above may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

REFERENCE SIGNS LIST

4 Substrate cleaning apparatus
9 Substrate
10 Controller
42 Substrate holder
46 Heating part
441 Processing solution supply part
442 Removal liquid supply part
901 Particle retention layer
S11 to S14, S11a, S11b, S11c, S12a, S12b, S14a Step

The invention claimed is:

1. A substrate cleaning apparatus comprising:
a processing solution supply part that supplies a processing solution containing solvent and solute, onto a top of a substrate;
a removal liquid supply part that supplies a removal liquid onto said substrate; and
a controller that controls said processing solution supply part and said removal liquid supply part,
wherein said solvent has volatility,
said processing solution transforms into a particle retention layer as a result of at least part of said solvent being volatilized from said processing solution supplied onto said substrate and causing said processing solution to solidify or harden,
a solute component that is said solute contained in said particle retention layer or that is derived from said solute is insoluble or poorly soluble in said removal liquid, and said solvent is soluble in said removal liquid,
said solute component contained in said particle retention layer has a property of being altered to become soluble in said removal liquid when heated to a temperature higher than or equal to an alteration temperature, and
said particle retention layer is removed from the entire top of said substrate under control of said controller that, after said particle retention layer is formed on said substrate, controls said removal liquid supply part to supply said removal liquid to said particle retention layer without undergoing a process of altering said solute component of said particle retention layer, said particle retention layer in which part of said solvent remains without volatilizing being divided into fine pieces by dissolving said solvent in said removal liquid while said fine pieces of said particle retention layer are removed from the top of said substrate together with said removal liquid which is dispersed from the outer edge of said substrate.

2. The substrate cleaning apparatus according to claim 1, further comprising:
a heating part that heats said particle retention layer,
wherein said controller controls said heating part to heat said particle retention layer up to a temperature lower than said alteration temperature before said removal liquid is supplied to said particle retention layer.

3. The substrate cleaning apparatus according to claim 2, wherein
said processing solution supply part supplies said processing solution to an upper face of said substrate held in a horizontal position, and
said heating part heats said particle retention layer by supplying heated deionized water to a lower face of said substrate.

4. The substrate cleaning apparatus according to claim 2, wherein
said processing solution supply part supplies said processing solution to an upper face of said substrate held in a horizontal position, and
said heating part heats said particle retention layer by supplying heated deionized water to the upper face of said substrate.

5. The substrate cleaning apparatus according to claim 1, wherein
said removal liquid supply part supplies said removal liquid that is heated up to a temperature lower than said alteration temperature, onto said substrate.

6. The substrate cleaning apparatus according to claim 1, wherein
said processing solution supply part supplies said processing solution that is heated up to a temperature lower than said alteration temperature, onto said substrate.

7. The substrate cleaning apparatus according to claim 1, further comprising:

a heating part that heats said substrate up to a temperature lower than said alteration temperature before or in parallel with the supply of said processing solution to said substrate.

8. The substrate cleaning apparatus according to claim 1, further comprising:
a substrate holder that holds a substrate;
wherein operations from supplying said processing solution to said substrate to supplying said removal liquid to said substrate are performed while said substrate is held by said substrate holder.

9. A substrate cleaning method comprising:
a) supplying a processing solution containing solvent and solute, onto a top of a substrate; and
b) supplying a removal liquid onto said substrate,
wherein said solvent has volatility,
in said operation a), said processing solution transforms into a particle retention layer as a result of at least part of the solvent being volatilized from said processing solution supplied onto said substrate and causing said processing solution to solidify or harden,
a solute component that is said solute contained in said particle retention layer or that is derived from said solute is insoluble or poorly soluble in said removal liquid, and said solvent is soluble in said removal liquid,
said solute component contained in said particle retention layer has a property of being altered to become soluble in said removal liquid when heated to a temperature higher than or equal to an alteration temperature, and
after said operation a), said particle retention layer is removed from the entire top of said substrate by performing said operation b) without undergoing a process of altering said solute component of said particle retention layer, said particle retention layer in which part of said solvent remains without volatilizing being divided into fine pieces by dissolving said solvent in said removal liquid while said fine particles of said particle retention layer are removed from the top of said substrate together with said removal liquid which is dispersed from the outer edge of said substrate in said operation b).

10. The substrate cleaning method according to claim 9, further comprising:
c) heating said particle retention layer up to a temperature lower than said alteration temperature, between said operation a) and said operation b).

11. The substrate cleaning method according to claim 10, wherein
in said operation a), said processing solution is supplied to an upper face of said substrate held in a horizontal position, and
in said operation c), said particle retention layer is heated by supplying heated deionized water to a lower face of said substrate.

12. The substrate cleaning method according to claim 10, wherein
in said operation a), said processing solution is supplied to an upper face of said substrate held in a horizontal position, and in said operation c), said particle retention layer is heated by supplying heated deionized water to the upper face of said substrate.

13. The substrate cleaning method according to claim 9, wherein
in said operation b), said removal liquid that is heated up to a temperature lower than said alteration temperature is supplied onto said substrate.

14. The substrate cleaning method according to claim 9, wherein
in said operation a), said processing solution that is heated up to a temperature lower than said alteration temperature is supplied onto said substrate.

15. The substrate cleaning method according to claim 9, wherein
said substrate is heated up to a temperature lower than said alteration temperature before or during said operation a).

16. The substrate cleaning method according to claim 9, wherein
operations from supplying said processing solution to said substrate to supplying said removal liquid to said substrate are performed while said substrate is held by a same substrate holder.

17. The substrate cleaning apparatus according to claim 1, wherein
said particle retention layer is removed from said substrate while said particle retention layer being divided into fine pieces by replacing molecules of said solvent remaining between molecules of said solute component of said particle retention layer with said removal liquid.

18. The substrate cleaning apparatus according to claim 1, wherein
said particle retention layer is removed from said substrate while said particle retention layer being divided into fine pieces by physical force received from said removal liquid.

19. The substrate cleaning method according to claim 9, wherein
in said operation b), said particle retention layer is removed from said substrate while said particle retention layer being divided into fine pieces by replacing molecules of said solvent remaining between molecules of said solute component of said particle retention layer with said removal liquid.

20. The substrate cleaning method according to claim 9, wherein
in said operation b), said particle retention layer is removed from said substrate while said particle retention layer being divided into fine pieces by physical force received from said removal liquid.

21. The substrate cleaning apparatus according to claim 1, further comprising
a substrate rotation mechanism, wherein
said removal liquid is supplied onto said substrate while said substrate is rotated by said substrate rotation mechanism under control of said controller.

22. The substrate cleaning method according to claim 9, wherein
said removal liquid is supplied onto said substrate while said substrate is rotated in said operation b).

* * * * *